(12) United States Patent
Kondo et al.

(10) Patent No.: US 10,014,895 B2
(45) Date of Patent: Jul. 3, 2018

(54) RECEIVER, RADIO COMMUNICATION DEVICE, AND RADIO COMMUNICATION METHOD

(71) Applicant: KABUSHIKI KAISHA TOSHIBA, Minato-ku (JP)

(72) Inventors: Satoshi Kondo, Kawasaki (JP); Akihide Sai, Yokohama (JP); Masanori Furuta, Odawara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/409,918

(22) Filed: Jan. 19, 2017

(65) Prior Publication Data

US 2017/0214517 A1 Jul. 27, 2017

(30) Foreign Application Priority Data

Jan. 22, 2016 (JP) .................. 2016-010792

(51) Int. Cl.
  *H04B 1/16* (2006.01)
  *H03L 7/08* (2006.01)
  *G06F 1/32* (2006.01)
(52) U.S. Cl.
  CPC ............ *H04B 1/16* (2013.01); *G06F 1/3278* (2013.01); *H03L 7/08* (2013.01); *H03L 7/0802* (2013.01); *H03L 2207/50* (2013.01)

(58) Field of Classification Search
  CPC ......... H03L 7/085; H03L 7/0802; G06F 1/32; H04B 1/16; H04W 52/00
  USPC ...................................................... 375/316
  See application file for complete search history.

(56) References Cited

U.S. PATENT DOCUMENTS 7,006,589 B2  2/2006  Staszewski et al.

FOREIGN PATENT DOCUMENTS

JP  61-199343  9/1986
JP  2000-251417  9/2000

*Primary Examiner* — Michael Neff
(74) *Attorney, Agent, or Firm* — Oblon, McClelland, Maier & Neustadt, L.L.P.

(57) ABSTRACT

A receiver has an oscillator to output an oscillation signal, a receiver to perform reception processing of a reception signal, a phase frequency detector to output a first signal in response to a phase and a frequency of the oscillation signal so as to generate a second signal indicating a reference phase, a differentiator to generate a third signal being a difference between the first signal and the second signal, an oscillator controller to generate a fourth signal for controlling a phase and a frequency of the oscillator, a phase initializer to output an initialization signal for synchronizing a phase of the second signal with a phase of the first signal, a trigger signal generator to output a trigger signal indicating timing with which the phase initializer outputs the initialization signal, and a power supply controller to control whether to supply a power supply voltage.

20 Claims, 8 Drawing Sheets

RECEIVER, RADIO COMMUNICATION DEVICE, AND RADIO COMMUNICATION METHOD

CROSS REFERENCE TO RELATED APPLICATIONS

This application is based upon and claims the benefit of priority from the prior Japanese Patent Application No. 2016-10792, filed on Jan. 22, 2016, the entire contents of which are incorporated herein by reference.

FIELD

Embodiments of the present disclosure relate to a receiver, a radio communication device, and a radio communication method.

BACKGROUND

A radio communication receiver has importance of standby power reduction during reception standby. Particularly, a PLL circuit used for a local oscillator considerably contributes to power consumption of the entire receiver. Conventionally, the following technique has been proposed for a measure for standby power reduction in the PLL circuit. A switch is interposed between a charge pump and a low pass filter in the PLL circuit, and electric charges are charged in the low pass filter while the switch is on. When the switch is turned off after that, supply of power to the charge pump is suspended and additionally the electric charges charged in the low pass filter are used so that an oscillation frequency of a power controlled oscillator remains constant.

However, the electric charges charged in the low pass filter discharge as time passes so that a frequency and a phase of an oscillation signal of the voltage controlled oscillator gradually shift. The oscillation frequency is not locked to a desired frequency so that the frequency and the phase of the oscillation signal may shift further due to phase noise of the oscillator itself. After that, when the switch is on and then PLL control resumes, a large phase error is detected immediately after the resumption. Even when no shift provisionally occurs in the oscillation frequency, the oscillation frequency temporarily considerably varies. Accordingly, the conventional measure for the standby power reduction cannot suspend the PLL control over a much long period so that there is a problem that the power consumption cannot be much reduced. The above effect due to phase noise of the oscillator itself cannot be solved even when a measure is performed against the discharge of the electric charges in the low pass filter.

DETAILED DESCRIPTION

According to one embodiment, a receiver comprising:
an oscillator to output an oscillation signal;
a receiver to perform reception processing of a reception signal in synchronization with the oscillation signal;
a phase frequency detector to output a first signal in response to a phase and a frequency of the oscillation signal, based on a reference signal;
a reference phase generator to integrate a frequency control signal so as to generate a second signal indicating a reference phase;
a differentiator to generate a third signal being a difference between the first signal and the second signal;
an oscillator controller to generate a fourth signal for controlling a phase and a frequency of the oscillator, based on the third signal;
a phase initializer to output an initialization signal for synchronizing a phase of the second signal with a phase of the first signal;
a trigger signal generator to output a trigger signal indicating timing with which the phase initializer outputs the initialization signal; and
a power supply controller to control whether to supply a power supply voltage to the phase frequency detector, the reference phase generator, the differentiator, the oscillator controller, and the phase initializer, based on the trigger signal.

Embodiments of the present disclosure will be described below with reference to the drawings.

First Embodiment

Figure 1:
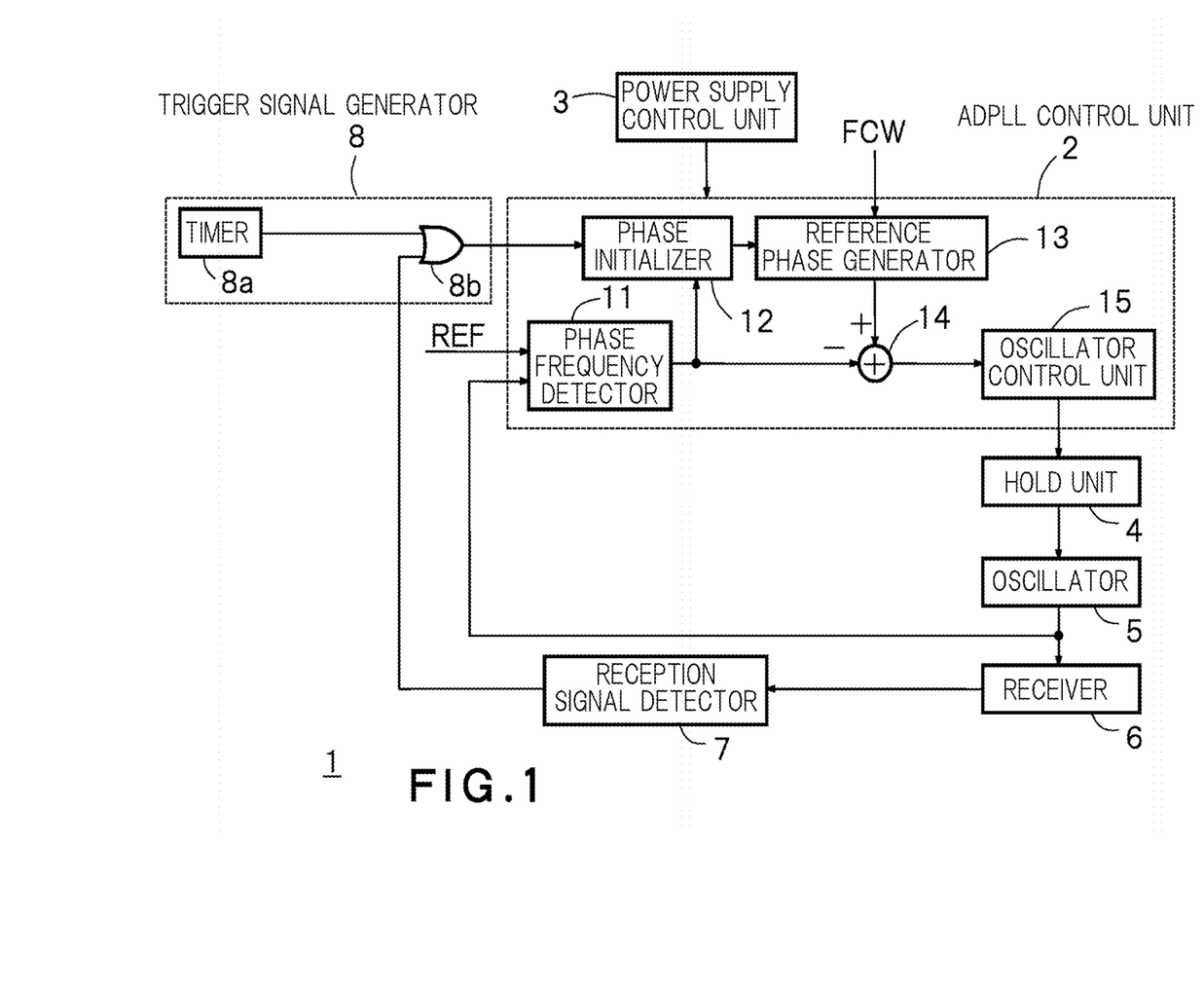
FIG. 1 is a block diagram of a schematic configuration of a receiver according to a first embodiment.

FIG. 1 is a block diagram of a schematic configuration of a receiver 1 according to a first embodiment. The receiver 1 in FIG. 1 includes an all digital phase-locked loop (ADPLL) control unit (ADPLL controller) 2, a power supply control unit (power supply controller) 3, a hold unit 4, an oscillator 5, a receiver 6, a reception signal detector 7, and a trigger signal generator 8. Each of the units in the receiver 1 in FIG. 1 basically, totally includes a digital circuit.

The oscillator 5 is a digital controlled oscillator (DCO) that digitally controls a frequency and a phase of an oscillation signal.

The ADPLL control unit 2 generates an oscillation control signal for controlling the frequency and the phase of the oscillation signal output from the oscillator 5 by a digital PLL circuit. An internal configuration of the ADPLL control unit 2 will be described later.

The power supply control unit 3 controls whether a power supply voltage is supplied to the ADPLL control unit 2. As described later, the power supply control unit 3 intermittingly supplies the power supply voltage to the ADPLL control unit 2 and achieves reduction of power consumption during standby for a reception signal.

The hold unit 4 retains the oscillation control signal output from the ADPLL control unit 2. The oscillator 5 controls the frequency and the phase of the oscillation signal based on the oscillation control signal retained by the hold unit 4.

The receiver 6 performs reception processing of the reception signal in synchronization with the oscillation signal. The reception signal detector 7 detects whether the receiver 6 has received the reception signal in a predetermined frequency band, and outputs a detection signal when detecting that the receiver 6 has received the reception signal in the predetermined frequency band.

The trigger signal generator 8 generates a trigger signal based on the detection signal detected by the reception signal detector 7 and time measured by a timer 8a. As described later, the trigger signal is used for the purpose that the power supply control unit 3 determines whether to supply the power supply voltage to the ADPLL control unit 2.

The trigger signal generator 8 includes the timer 8a and an OR circuit 8b. The timer 8a is used to measure a time period during which the trigger signal is generated, during a standby period for the reception signal. More specifically, the timer 8a measures a time length for predetermined time Ti, and then outputs a time-up signal when the predetermined time Ti has passed since a start of the measurement. After that, the timer 8a is temporarily reset and then starts measuring the time again. The OR circuit 8b generates and outputs the trigger signal corresponding to the logical sum of the detection signal of the reception signal detector 7 and the output signal of the timer 8a.

The ADPLL control unit 2 includes a phase frequency detector 11, a phase initializer 12, a reference phase generator 13, a differentiator 14, and an oscillator control unit (oscillator controller) 15.

The phase frequency detector 11 generates and outputs a first signal in response to the frequency and the phase of the oscillation signal of the oscillator 5, based on a reference signal REF.

The reference phase generator 13 integrates a frequency control signal FCW in synchronization with the reference signal REF so as to generate and output a second signal indicating a reference phase.

The differentiator 14 generates and outputs a third signal being a difference between the first signal and the second signal. The third signal is a phase error signal being a difference between the reference phase and an oscillator phase of the oscillation signal. The oscillator control unit 15 generates and outputs the oscillation control signal based on the third signal.

When the trigger signal is input, the phase initializer 12 outputs an initialization signal for initializing a phase of the third signal.

When the initialization signal from the phase initializer 12 is input, the reference phase generator 13 outputs, as the second signal, the first signal itself, instead of the data obtained by integrating the frequency control signal FCW.

That is, the reference phase generator 13 synchronizes a phase of the second signal with a phase of the first signal when the trigger signal generator 8 outputs the trigger signal. When the initialization signal from the phase initializer 12 is not input, the reference phase generator 13 generates and outputs the second signal based on the data obtained by integrating the frequency control signal FCW. That is, the reference phase generator 13 generates the second signal based on the data obtained by integrating the frequency control signal FCW in synchronization with the reference signal REF, while the trigger signal generator 8 does not output the trigger signal.

Figure 2:
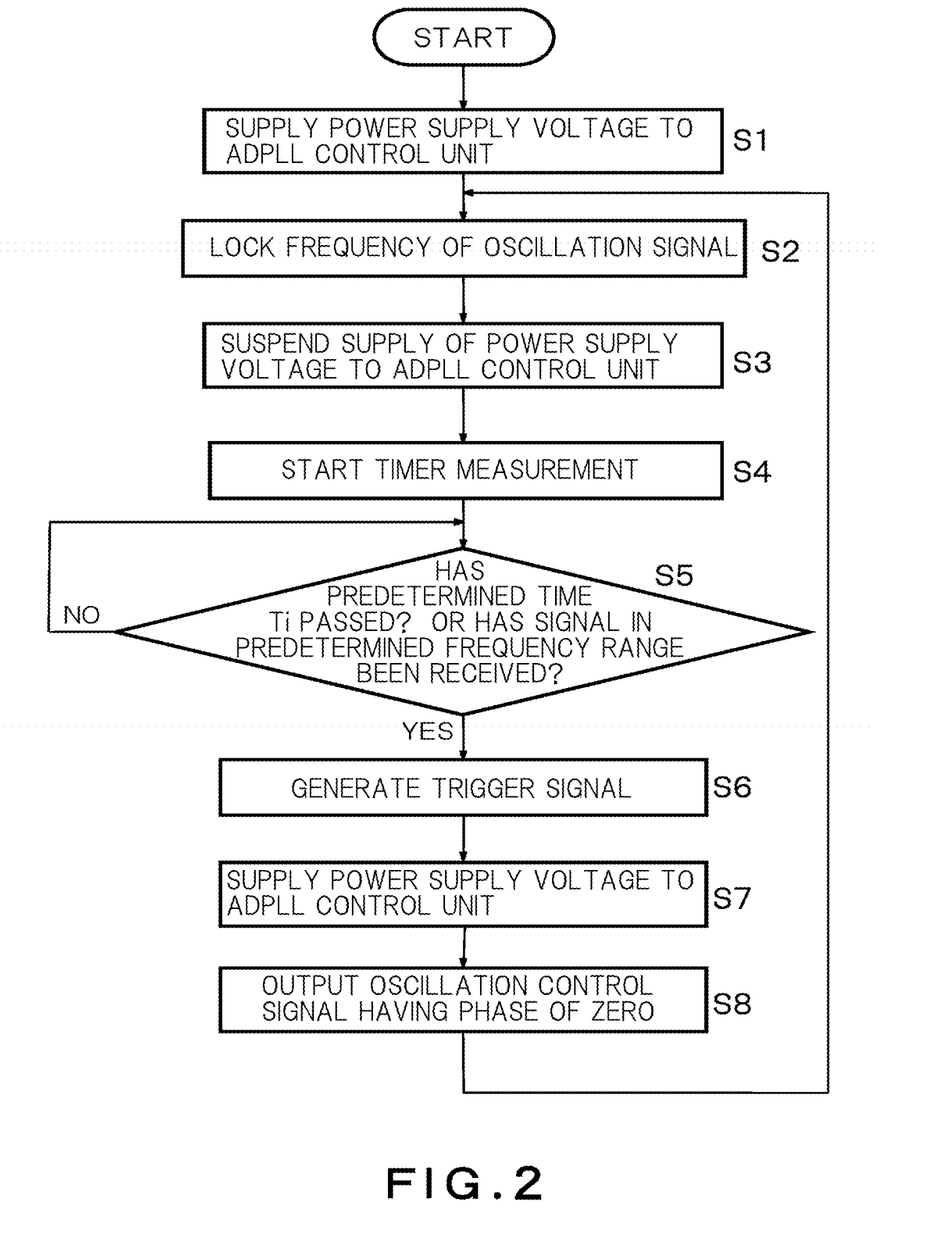
FIG. 2 is a flow chart of an exemplary processing procedure during standby of the receiver in FIG. 1.

FIG. 2 is a flow chart of an exemplary processing procedure during standby of the receiver 1 in FIG. 1 When the standby starts, the power supply control unit 3 supplies the power supply voltage to the ADPLL control unit 2 (step S1), and the ADPLL control unit 2 performs PLL control that locks the frequency of the oscillation signal of the oscillator 5 to a desired frequency determined with the frequency control signal FCW (step S2).

When the lock is made to the desired frequency, the power supply control unit 3 suspends the supply of the power supply voltage to the ADPLL control unit 2 (step S3). The hold unit 4 retains the oscillation control signal output by the oscillator control unit 15 when the lock is made. Therefore, even when the supply of the power supply voltage to the ADPLL control unit 2 is suspended, the oscillator 5 generates the oscillation signal based on the oscillation control signal retained by the hold unit 4. By suspending the supply of the power supply voltage to the ADPLL control unit 2, it is possible to achieve the reduction of the power consumption of the receiver 1.

At a point in time at which the supply of the power supply voltage to the ADPLL control unit 2 is suspended, the timer 8a is temporarily reset and then the timer measurement starts (step S4). The timer 8a is used to regularly output the trigger signal by the trigger signal generator 8.

The trigger signal generator 8 remains on standby until the measurement time by the timer 8a becomes the previously determined time Ti or until the reception signal detector 7 detects the reception of the reception signal in the predetermined frequency band (step S5). During the standby, the oscillator 5 generates the oscillation signal based on the oscillation control signal retained by the hold unit 4.

When the measurement time by the timer 8a becomes the previously determined time Ti or when the reception signal detector 7 detects the reception of the reception signal in the predetermined frequency band, the trigger signal generator 8 generates and outputs the trigger signal (step S6). When receiving the trigger signal, the power supply control unit 3 starts the supply of the power supply voltage to the ADPLL control unit 2 (step S7). Accordingly, the phase frequency detector 11 generates and outputs the first signal, and the phase initializer 12 outputs the initialization signal. The reference phase generator 13 outputs, as the second signal, the first signal itself. Therefore, the oscillator control unit 15 outputs the oscillation control signal having a phase of zero. The oscillator 5 generates the oscillation signal based on the oscillation control signal having a phase of zero (step S8). The receiver 1 receives the reception signal in synchronization with the oscillation signal so as to perform the reception processing. After that, the PLL control of the frequency of the oscillation signal is performed based on the first signal in response to the frequency and the phase of the oscillation signal detected by the phase frequency detector 11. That is, the processing at steps S2 to S8 is repeated during the standby period for the reception signal.

Figure 3:
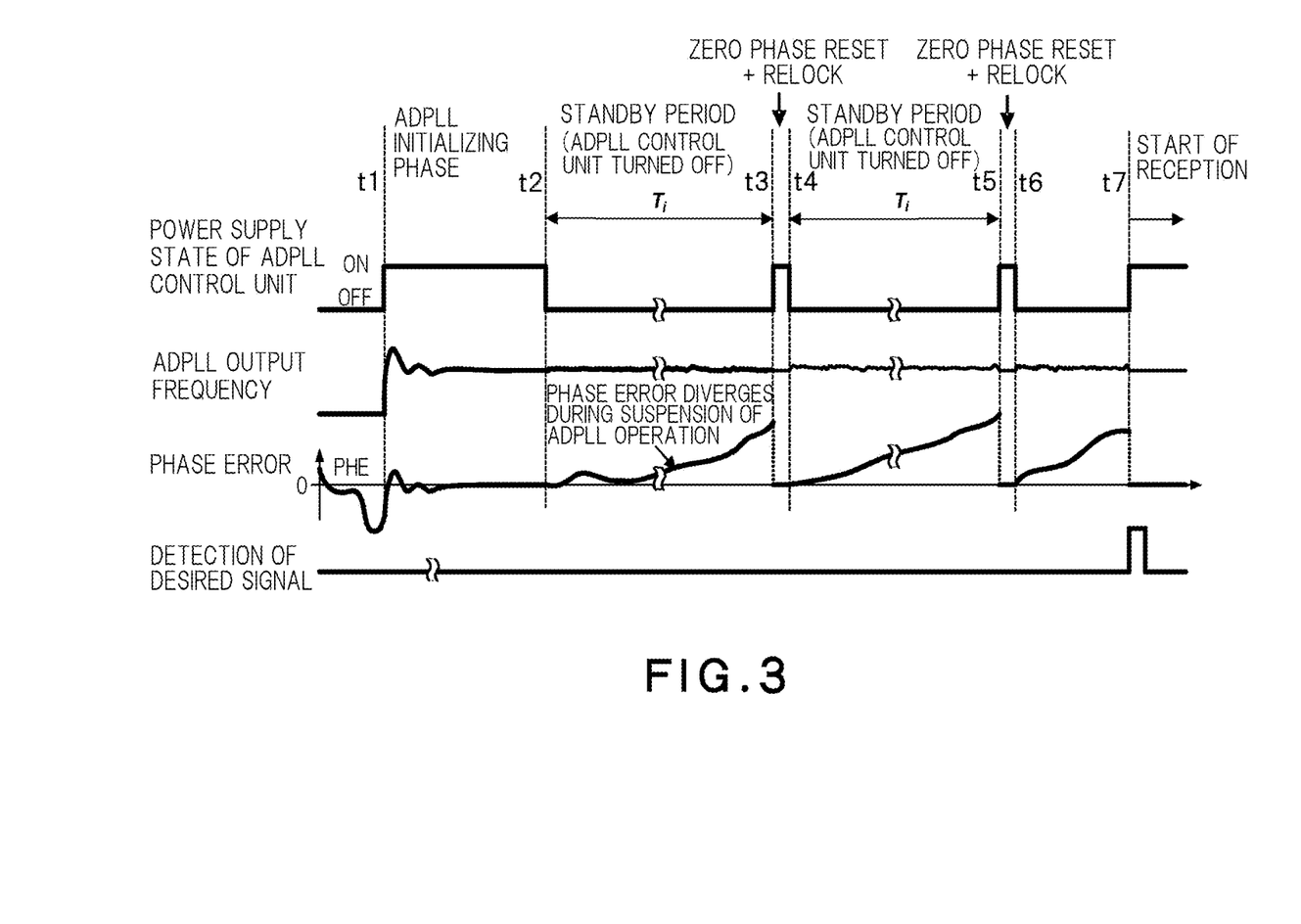
FIG. 3 is a waveform chart of timing during the standby of the receiver in FIG. 1.

FIG. 3 is a waveform chart of timing during the standby of the receiver 1 in FIG. 1. Between time t1 and time t2 in FIG. 3 is a period necessary for the ADPLL control unit 2 to lock the oscillation signal to the desired frequency. During the period, since the power supply control unit 3 supplies the power supply voltage to the ADPLL control unit 2, the ADPLL control unit 2 performs the PLL control so that the frequency of the oscillation control signal output from the ADPLL control unit 2 gradually becomes stable. The third signal corresponding to the phase error signal output from the differentiator 14, also decreases as the time t2 comes close.

When the ADPLL control unit 2 locks the oscillation signal to the desired frequency at the time t2, the power supply control unit 3 suspends the power supply to the ADPLL control unit 2 between the time t2 and time t3. The oscillator 5 generates the oscillation signal based on the oscillation control signal retained by the hold unit 4, during the period. For example, due to influence that the oscillation control signal retained by the hold unit 4 gradually varies, a phase error between the oscillation signal and the reference signal REF gradually increases and the amplitude of the third signal output from the differentiator 14 gradually increases.

When the measurement time by the timer 8a reaches the predetermined time Ti at the time t3, the trigger signal generator 8 outputs the trigger signal. Accordingly, the power supply control unit 3 supplies the power supply voltage to the ADPLL control unit 2 again between the time t3 and time t4. At the time t4, the third signal corresponding to the phase error output from the differentiator 14 becomes a signal having a phase of zero due to the initialization signal from the phase initializer 12. Therefore, the phase error between the oscillation signal and the reference signal REF becomes zero so that the frequency of the oscillation signal barely considerably varies and the frequency of the oscillation signal is locked in a relatively short time.

At the time t4, the power supply control unit 3 suspends the supply of the power supply voltage to the ADPLL control unit 2 again. Accordingly, the phase error gradually increases and the amplitude of the third signal increases between the time t4 and time t5, similarly between the time t2 and the time t3.

The measurement time by the timer 8a reaches the predetermined time Ti again at the time t5 so that the trigger signal is output. Between the time t5 and time t6, the power supply voltage is supplied to the ADPLL control unit 2 so that the PLL control of the oscillation signal is performed again. At the time t6, the frequency of the oscillation signal is locked.

After that, the power supply control unit 3 suspends the supply of the power supply voltage to the ADPLL control unit 2 again between the time t6 and time t7. Accordingly, similarly between the time t2 and the time t3, the phase error between the oscillation signal and the reference signal REF gradually increases. When the reception signal detector 7 detects the reception of the reception signal in the predetermined frequency band at the time t7, the trigger signal generator 8 outputs the trigger signal. Accordingly, even before the measurement time by the timer 8a reaches the predetermined time Ti, the power supply control unit 3 resumes the supply of the power supply voltage to the ADPLL control unit 2 so that the phase error between the oscillation signal and the reference signal REF becomes zero. After that, the receiver 6 performs the reception processing.

Figure 4:
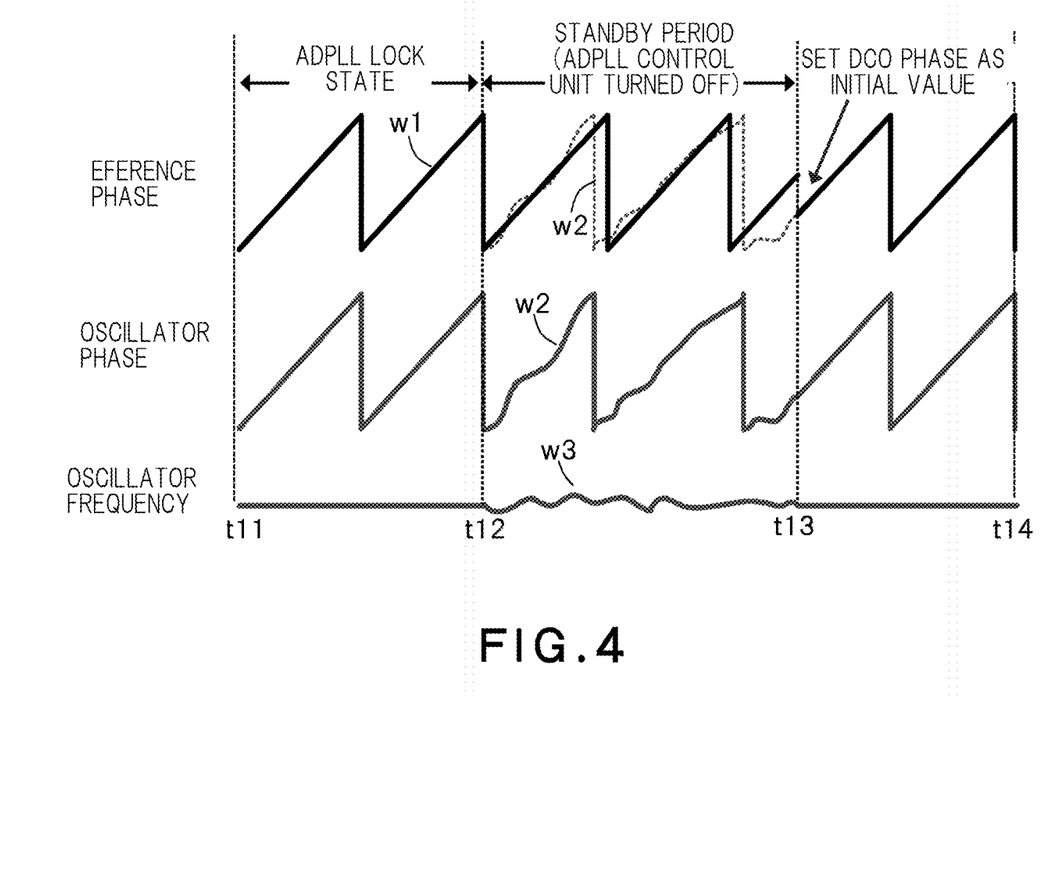
FIG. 4 is a waveform chart illustrating a waveform of a third signal indicating a reference phase generated by a reference phase generator, a waveform of a first signal indicating an oscillator phase of an oscillation signal output from an oscillator, and a waveform of the oscillation signal.

FIG. 4 is a waveform chart illustrating a waveform w1 of the third signal indicating the reference phase generated by the reference phase generator 13, a waveform w2 of the first signal indicating the oscillator phase of the oscillation signal output from the oscillator 5, and a waveform w3 of the oscillation signal.

Time t11 to time t12 in FIG. 4 is a period during which the ADPLL control unit 2 performs the PLL control of the oscillation signal. The oscillator phase and the reference phase correspond to each other, and the frequency of the oscillation signal remains constant. Between the time t12 and time t13 is a standby period during which the power supply control unit 3 suspends the power supply voltage to the ADPLL control unit 2. During the period, the oscillation control signal retained by the hold unit 4 varies so that the oscillation phase varies. FIG. 4 illustrates the waveform w2 of the first signal with a broken line in superimposition on the third signal indicating the reference phase. In this manner, when the power supply voltage to the ADPLL control unit 2 is suspended, the PLL control of the oscillation signal is not performed so that the oscillator phase and the frequency of the oscillation signal vary. When the trigger signal is output at the time t13, the phase initializer 12 forcibly performs processing of synchronizing the oscillator phase and the reference phase, so that a shift of the oscillation frequency of the oscillation signal disappears.

Figure 5:
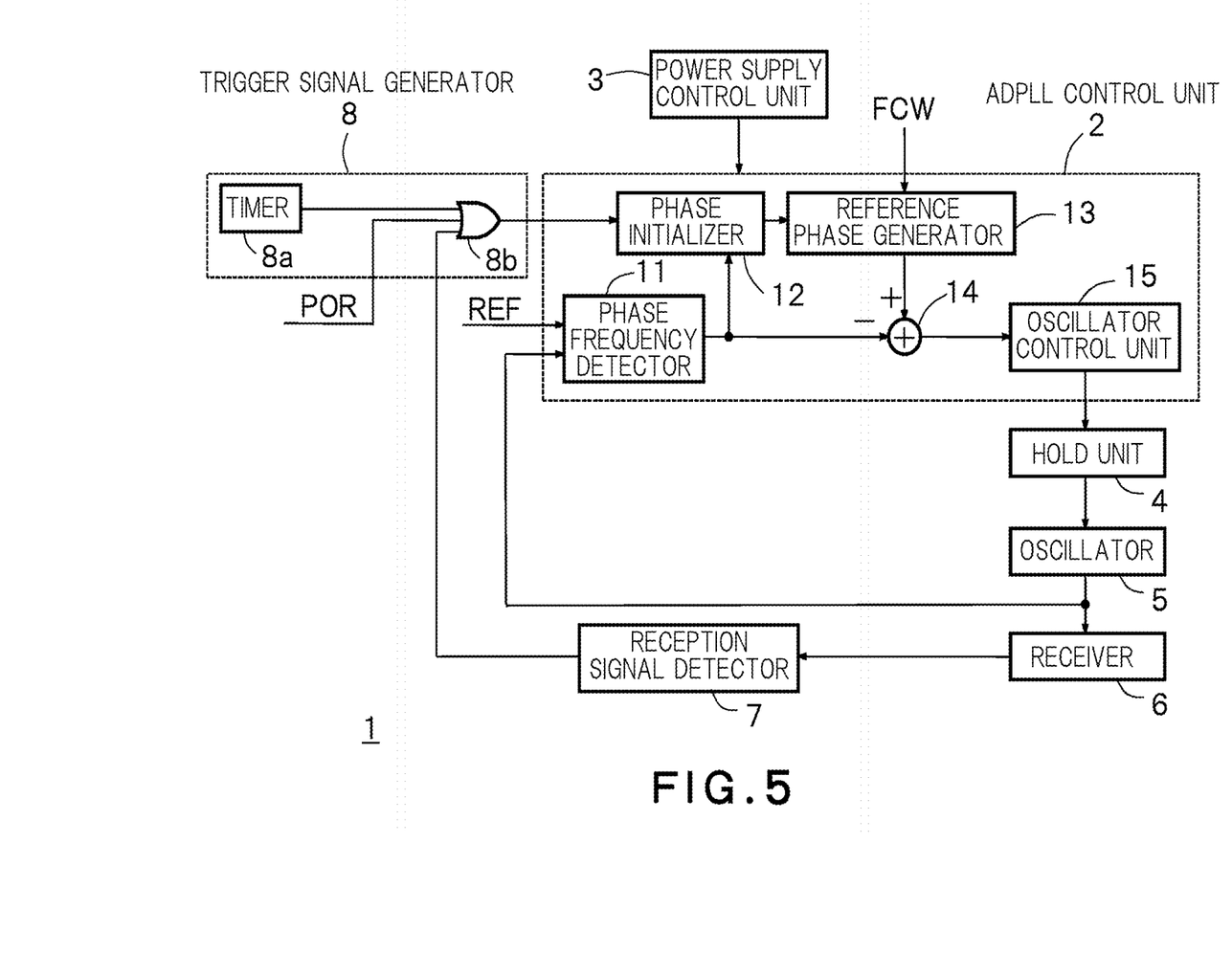
FIG. 5 is a block diagram of a schematic configuration of a receiver according to a modification of FIG. 1.

FIG. 5 is a block diagram of a schematic configuration of a receiver 1 according to a modification of FIG. 1. The receiver 1 in FIG. 5 is similar to that in FIG. 1 except an internal configuration of a trigger signal generator 8 different from that in FIG. 1. The trigger signal generator 8 in FIG. 5 generates the trigger signal with any of the signal every predetermined time Ti from the timer 8a, the output signal of the reception signal detector 7, and a power-on reset signal POR of the receiver 1. Accordingly, during a power-on reset of the receiver 1, the phase of the third signal output from the differentiator 14 becomes zero so that the frequency and the phase of the oscillation signal can be stabilized in a short time.

In this manner, according to the present embodiment, when the ADPLL control unit 2 performs the PLL control of the oscillation signal and then the oscillation signal is locked to the desired frequency, the supply of the power supply voltage to the ADPLL control unit 2 is suspended. After that, the supply of the power supply voltage to the ADPLL control unit 2 is temporarily performed every predetermined time by the timer 8a or when the signal in the predetermined frequency band is received. In supplying the power supply voltage to the ADPLL control unit 2 during the standby period, the phase initializer 12 sets the reference phase in synchronization with the oscillator phase. Thus, a risk that the frequency of the oscillation signal considerably varies immediately after the ADPLL control unit 2 resumes the PLL control, disappears so that the frequency and the phase of the oscillation signal can be promptly stabilized. Accordingly, a period during which the power supply voltage is supplied to the ADPLL control unit 2 during the standby period can shorten, the shift of each of the frequency and the phase of the oscillation signal decreases, and additionally the reduction of the power consumption can be achieved.

Second Embodiment

A second embodiment is to generate the trigger signal when the frequency of the oscillation signal output from the oscillator 5 shifts.

Figure 6:
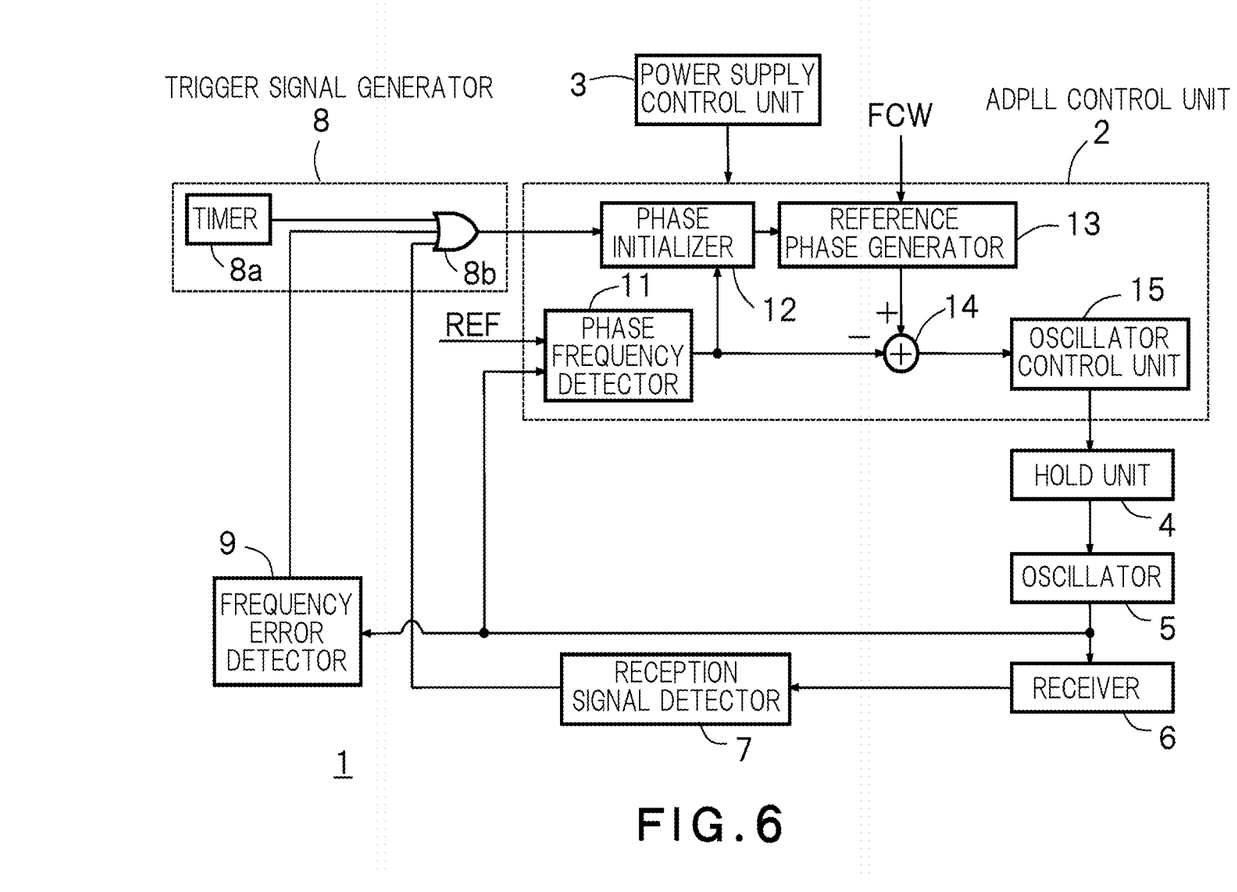
FIG. 6 is a block diagram of a schematic configuration of a receiver according to a second embodiment.

FIG. 6 is a block diagram of an exemplary configuration of a receiver 1 according to the second embodiment. The receiver 1 in FIG. 6 includes the configuration in FIG. 1 and additionally includes a frequency error detector 9. The frequency error detector 9 detects whether the frequency of the oscillation signal output from the oscillator 5 shifts out of a previously determined range, and outputs a frequency error signal when the shift occurs out of the range. The frequency error signal is input to the trigger signal generator 8.

When at least one of the timer signal output every predetermined time Ti from the timer 8a, the signal output from the reception signal detector 7, and the frequency error signal, is input, the trigger signal generator 8 generates the trigger signal.

Accordingly, even when the frequency of the oscillation signal shifts due to some types of reasons while the supply of the power supply voltage to the ADPLL control unit 2 is suspended, the receiver 1 according to the second embodiment sets the reference phase in synchronization with the oscillator phase so as to make the third signal output from the differentiator 14 a signal having a phase difference of zero. Thus, there is no risk that the frequency and the phase of the oscillation signal considerably shift immediately after the supply of the power supply voltage to the ADPLL control unit 2 resumes. Therefore, it is possible to lengthen a period during which the supply of the power supply voltage to the ADPLL control unit 2 is suspended during the standby time, thereby reducing the power consumption.

Note that, a power-on reset signal POR similarly to FIG. 5 may be input to the trigger signal generator 8 in FIG. 6 and then the trigger signal may be output during a power-on reset.

The embodiments of the present disclosure have been described. The embodiments have been exemplarily presented, and do not tend to limit the scope of the disclosure. The new embodiments can be performed with other various modes, and various omissions, replacements, and alterations may be made without departing from the scope of the spirit of the disclosure. The embodiments and modifications thereof are included in the scope and spirit of the disclosure, and additionally are included in the scope of the disclosure described in the claims and equivalents thereof.

Third Embodiment

The receivers 1 according to the first and second embodiments described above can be applied to a receiving circuit 61 or the receiving circuit 61 in a radio communication device 63 including the receiving circuit 61 and a transmitting circuit 62.

Figure 7:
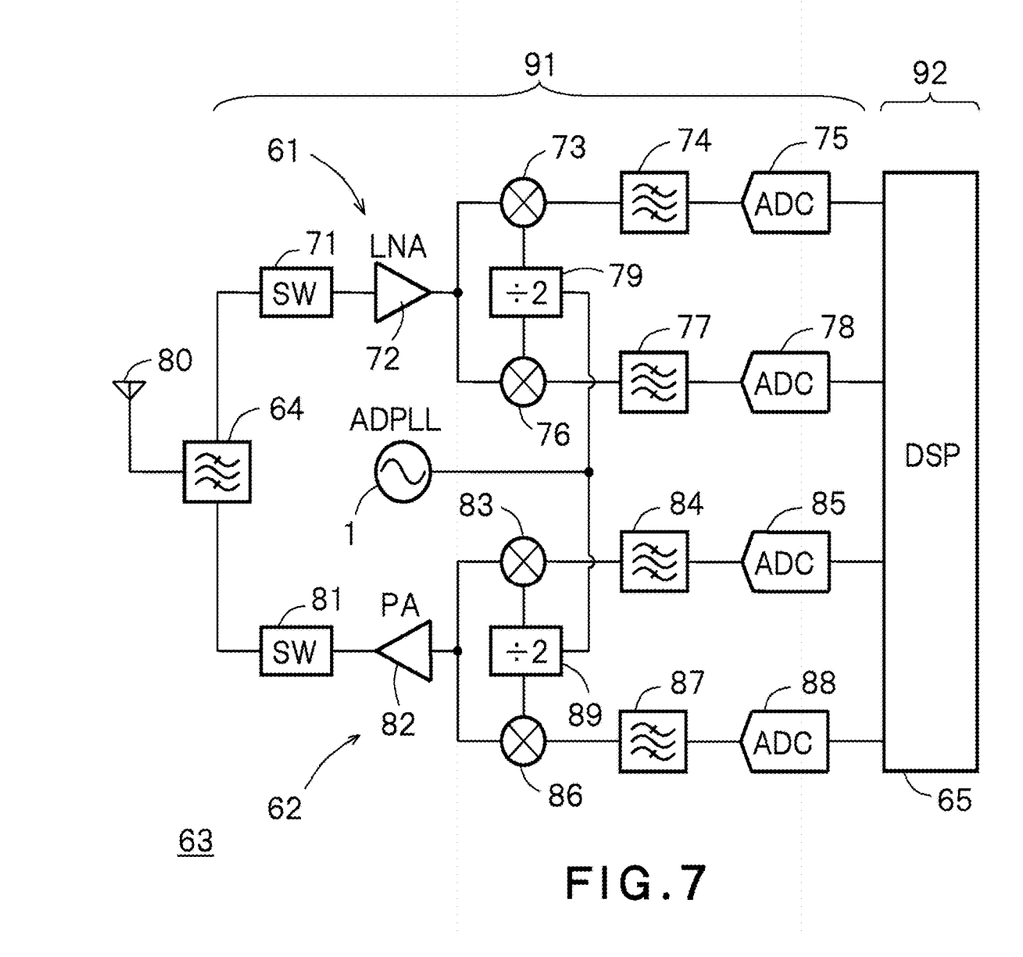
FIG. 7 is a block diagram of an internal configuration of a radio communication device including a receiving circuit having a configuration the same as any one of the receivers having ADPLL configurations according to the first and second embodiments.

FIG. 7 is a block diagram of an internal configuration of the radio communication device 63 including the receiving circuit 61 having the same configuration as any of the receivers 1 having the ADPLL configurations according to the first and second embodiments.

The radio communication device 63 in FIG. 7 includes an RF unit 91 and a baseband unit 92. The RF unit 91 includes the transmitting circuit 62, the receiving circuit 61, an oscillator 60 that generates a local oscillation signal to be shared by the transmitting circuit 62 and the receiving circuit 61, and a bandpass filter (BPF) 64 coupled to an antenna unit 80. The baseband unit 92 includes a signal processing unit (DSP) 65 that performs baseband processing.

The oscillator 60 in FIG. 7 corresponds to the ADPLL control unit 2, the power supply control unit 3, the hold unit 4, the oscillator 5, the reception signal detector 7, and the trigger signal generator 8 in FIG. 1. The receiving circuit 61 in FIG. 7 corresponds to the receiver 6 in FIG. 1. The entire radio communication device 63 in FIG. 7 can include an integrated circuit (IC) on one chip. Alternatively, the radio communication device 63 in FIG. 7 may include a plurality of chips. For example, the RF unit 91 and the baseband unit 92 each may include a separate chip, the RF unit 91 may include a plurality of chips, or the baseband unit 92 may include a plurality of chips.

The receiving circuit 61 includes a transmission-and-reception changeover switch 71, a low noise amplifier (LNA) 72, an I signal reception mixer (MIX) 73, a low pass filter (LPF) 74, an A/D converter (ADC) 75, a Q signal reception mixer (MIX) 76, a low pass filter (LPF) 77, an A/D converter (ADC) 78, and a frequency divider 79 that frequency-divides the local oscillation signal from the oscillator 60.

The transmitting circuit 62 includes a transmission-and-reception changeover switch 81, a power amplifier (PA) 82, an I signal transmission mixer (MIX) 83, a low pass filter (LPF) 84, a D/A converter (DAC) 85, a Q signal transmission mixer (MIX) 86, a low pass filter (LPF) 87, a D/A converter (DAC) 88, and a frequency divider 89 that frequency-divides the local oscillation signal from the oscillator 60.

The signal processing unit 65 includes a transmission processing function, a reception processing function, and a function of performing processing of a media access control (MAC) layer or a host network hierarchy thereof.

The radio communication device 63 including the receiving circuit 61 and the transmitting circuit 62 in FIG. 7 each being a single body, may be provided.

The radio communication device 63 in FIG. 7 includes only the one antenna unit 80, but the number of the antennas is not particularly limited. For example, a transmission antenna unit 80 and a reception antenna unit 80 may be separately provided or an I signal antenna unit 80 and a Q signal antenna unit 80 may be separately provided. When only one antenna unit 80 is provided, a transmission-and-reception changeover switch at least switches the transmission and the reception.

The radio communication device 63 illustrated in FIG. 7 can be applied to a stationary radio communication device 63, such as an access point, a wireless router, or a computer, can be applied to a portable radio terminal, such as a smartphone or a mobile phone, can be applied to peripheral equipment, such as a mouse or a keyboard, that performs radio communication with a host device, can be applied to a card-typed member including a radio function built therein, or can be applied to a wearable terminal that performs radio communication of biological information. Various examples of a radio system of the radio communication between the radio communication devices 63 illustrated in FIG. 7, that can be applied are not particularly limited, and are applicable to third generation or later cellular communication, a wireless LAN, Bluetooth (registered trademark), and near-field radio communication.

Figure 8:
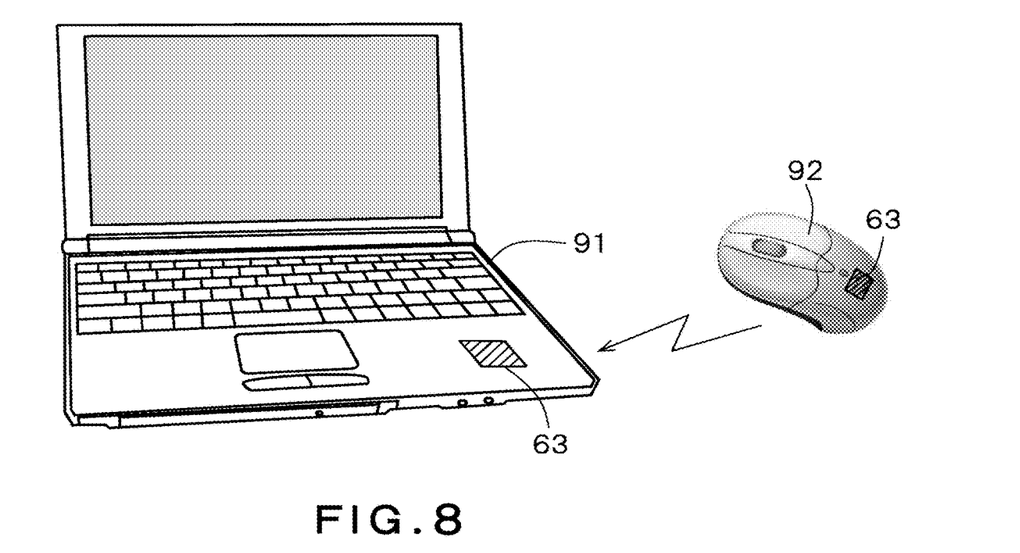
FIG. 8 is a view of an example of radio communication performed between a PC being a host device and a mouse being peripheral equipment.

FIG. 8 illustrates exemplary performance of radio communication between a PC 91 being a host device and a mouse 92 being peripheral equipment. Both of the PC 91 and the mouse 92 include the radio communication device 63 illustrated in FIG. 7 built therein. The mouse 92 uses power of a built-in battery so as to perform the radio communication, and is required to perform the radio communication with power consumption as low as possible because a space in which the battery is built is limited. Accordingly, it is preferable to perform the radio communication by using a radio system capable of low consumption radio communication, such as Bluetooth Low Energy defined in a standard of Bluetooth (registered trademark) 4.0, preferably performs the radio communication.

Figure 9:
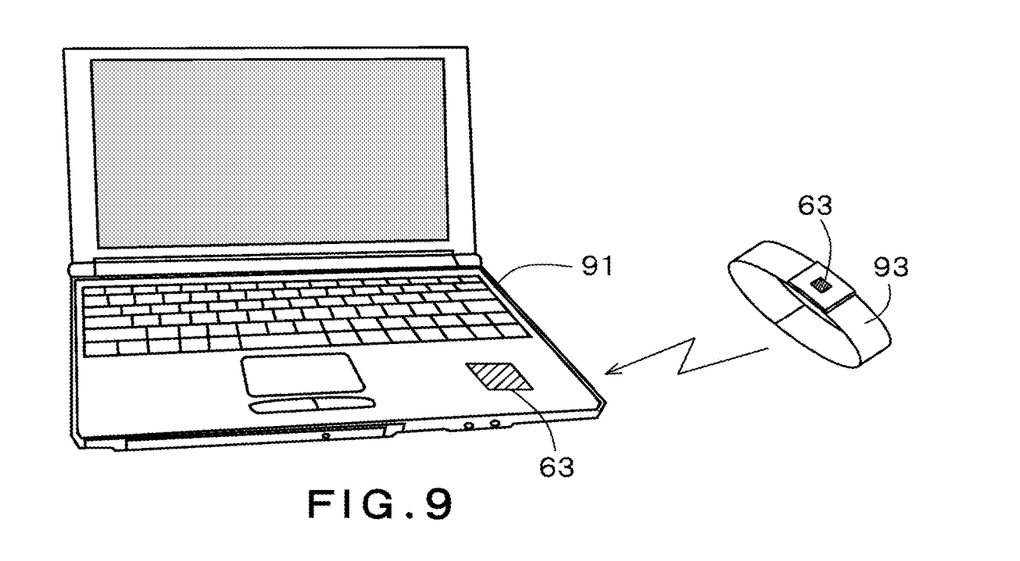
FIG. 9 is a view of an example of radio communication performed between a wearable terminal and the host device.

FIG. 9 illustrates exemplary performance of radio communication between a wearable terminal 93 and a host device (for example, the PC 91). The wearable terminal 93 is to be worn on a body of a person, and various examples thereof may include a seal type to be worn on a body, an eyeglasses type and an earphone type to be worn on a body except arms, and a pacemaker to be inserted inside a body, in addition to a type to be worn on an arm illustrated in FIG. 9. Both of the wearable terminal 93 and the PC 91 in FIG. 9 also include the radio communication device 63 illustrated in FIG. 7 built therein. Note that, examples of the PC 91 include a computer and a server. The above radio system capable of the radio communication with low power consumption, such as Bluetooth Low Energy, is also preferably adopted because the wearable terminal 93 is worn on a body of a person and a space for a built-in battery is limited.

When the radio communication is performed between the radio communication devices 63 illustrated in FIG. 7, the type of information to be transmitted and received through the radio communication is not limited. Note that, the radio system is preferably varied between a case where information including a large amount of data, such as moving image data, is transmitted and received and a case where information including a small amount of data, such as operation information of the mouse 92, is transmitted and received. Thus, there is a need to perform the radio communication in an optimum radio system in response to the amount of information to be transmitted and received.

Furthermore, when the radio communication is performed between the radio communication devices 63 illustrated in FIG. 7, a notifying unit that notifies a user of an operation state of the radio communication, may be provided. Specific examples of the notifying unit may include display of the operation state on a display device including LEDs, notification of the operation state by vibration of a vibrator, and notification of the operation state from audio information by a speaker or a buzzer.

At least one unit of the receivers 1 and the radio communication devices 63 described in the above respective embodiments, may include hardware or may include software. When the configuration including the software is provided, a program for achieving a function of the at least one unit of the receivers 1 and the radio communication devices 63, may be stored in a storage medium, such as a flexible disk or a CD-ROM, and then may be read and performed by a computer. The storage medium is not limited to a detachably attachable storage medium, such as a magnetic disk or an optical disc, and may be a non-removable storage medium, such as a hard disk or a memory.

The program for achieving the function of the at least one unit of the receivers 1 and the radio communication devices 63, may be distributed through a communication line, such as the Internet, (including radio communication). Furthermore, the program that has been encrypted, modulated, or compressed, may be distributed through a wired line or a wireless line, such as the Internet, or may be stored in a storage medium and then may be distributed.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A receiver comprising:
an oscillator to output an oscillation signal;
a receiver to perform reception processing of a reception signal in synchronization with the oscillation signal;
a phase frequency detector to output a first signal in response to a phase and a frequency of the oscillation signal, based on a reference signal;
a reference phase generator to integrate a frequency control signal so as to generate a second signal indicating a reference phase;
a differentiator to generate a third signal being a difference between the first signal and the second signal;
an oscillator controller to generate a fourth signal for controlling the phase and the frequency of the oscillator, based on the third signal;
a phase initializer to output an initialization signal for synchronizing a phase of the second signal with a phase of the first signal;
a trigger signal generator to output a trigger signal indicating timing with which the phase initializer outputs the initialization signal; and
a power supply controller to control whether to supply a power supply voltage to the phase frequency detector, the reference phase generator, the differentiator, the oscillator controller, and the phase initializer, based on the trigger signal.

2. The receiver according to claim 1,
wherein the reference phase generator outputs the second signal synchronizing with the phase of the first signal when the phase initializer outputs the initialization signal, and
the differentiator outputs the third signal indicating a phase difference of zero between the first signal and the second signal when the phase initializer outputs the initialization signal.

3. The receiver according to claim 1, further comprising a retainer to retain the fourth signal,
wherein the power supply controller suspends the supply of the power supply voltage to the phase frequency detector, the reference phase generator, the differentiator, the oscillator controller, and the phase initializer while the trigger signal is not output during a standby period for the reception signal, and
the oscillator controls the phase and the frequency of the oscillation signal based on the signal retained by the retainer while the trigger signal is not output during the standby period for the reception signal.

4. The receiver according to claim 3,
wherein the power supply controller temporarily performs the supply of the power supply voltage to the phase frequency detector, the reference phase generator, the differentiator, the oscillator controller, and the phase initializer when the trigger signal is output during the standby period for the reception signal, and suspends the supply of the power supply voltage to the phase frequency detector, the reference phase generator, the differentiator, the oscillator controller, and the phase initializer again after the phase and the frequency of the oscillation signal are reset, and
the oscillator controller generates the fourth signal based on the third signal indicating a phase difference of zero between the first signal and the second signal, the third signal being output from the differentiator, when the trigger signal is output during the standby period for the reception signal.

5. The receiver according to claim 1, further comprising
a reception signal detector to detect that the receiver has received the reception signal in a predetermined frequency band,
wherein the trigger signal generator outputs the trigger signal when the reception signal detector detects the reception of the reception signal in the predetermined frequency band.

6. The receiver according to claim 1, wherein the trigger signal generator outputs the trigger signal every predetermined time during a standby period of the reception signal.

7. The receiver according to claim 1, wherein the trigger signal generator outputs the trigger signal when a power supply of the receiver is turned on.

8. The receiver according to claim 1, further comprising
a frequency error detector to detect whether the frequency of the oscillation signal output from the oscillator is out of a previously determined frequency range,
wherein the trigger signal generator outputs the trigger signal when the frequency error detector detects that the frequency of the oscillation signal is out of the frequency range.

9. The receiver according to claim 1, further comprising an integrated circuit comprising the oscillator, the receiver, the phase frequency detector, the reference phase generator, the differentiator, the oscillator controller, the phase initializer, the trigger signal generator, and the power supply controller.

10. The receiver according to claim 1, further comprising at least one antenna.

11. A radio communication device comprising:
an RF unit including a transmitting circuit and a receiving circuit; and
a baseband unit,
wherein the receiving circuit comprises:
an oscillator to output an oscillation signal;
a receiver to perform reception processing of a reception signal in synchronization with the oscillation signal;
a phase frequency detector to output a first signal in response to a phase and a frequency of the oscillation signal, based on a reference signal;
a reference phase generator to integrate a frequency control signal so as to generate a second signal indicating a reference phase;
a differentiator to generate a third signal being a difference between the first signal and the second signal;
an oscillator controller to generate a fourth signal for controlling the phase and the frequency of the oscillator, based on the third signal;
a phase initializer to output an initialization signal for synchronizing a phase of the second signal with a phase of the first signal;
a trigger signal generator to output a trigger signal indicating timing with which the phase initializer outputs the initialization signal; and
a power supply controller to control whether to supply a power supply voltage to the phase frequency detector, the reference phase generator, the differentiator, the oscillator controller, and the phase initializer, based on the trigger signal.

12. The radio communication device according to claim 11,
wherein the reference phase generator outputs the second signal synchronizing with the phase of the first signal when the phase initializer outputs the initialization signal, and
the differentiator outputs the third signal indicating a phase difference of zero between the first signal and the second signal when the phase initializer outputs the initialization signal.

13. The radio communication device according to claim 11, further comprising
a retainer to retain the fourth signal,
wherein the power supply controller suspends the supply of the power supply voltage to the phase frequency detector, the reference phase generator, the differentiator, the oscillator controller, and the phase initializer while the trigger signal is not output during a standby period for the reception signal, and
the oscillator controls the phase and the frequency of the oscillation signal based on the signal retained by the retainer while the trigger signal is not output during the standby period for the reception signal.

14. The receiver according to claim 13,
wherein the power supply controller temporarily performs the supply of the power supply voltage to the phase frequency detector, the reference phase generator, the differentiator, the oscillator controller, and the phase initializer when the trigger signal is output during the standby period for the reception signal, and suspends the supply of the power supply voltage to the phase frequency detector, the reference phase generator, the differentiator, the oscillator controller, and the phase initializer again after the phase and the frequency of the oscillation signal are reset, and
the oscillator controller generates the fourth signal based on the third signal indicating a phase difference of zero between the first signal and the second signal, the third signal being output from the differentiator, when the trigger signal is output during the standby period for the reception signal.

15. The radio communication device according to claim 11, further comprising
a reception signal detector to detect that the receiver has received the reception signal in a predetermined frequency band,
wherein the trigger signal generator outputs the trigger signal when the reception signal detector detects the reception of the reception signal in the predetermined frequency band.

16. The radio communication device according to claim 11, wherein the trigger signal generator outputs the trigger signal every predetermined time during a standby period of the reception signal.

17. The radio communication device according to claim 11, wherein the trigger signal generator outputs the trigger signal when a power supply of the receiver is turned on.

18. The radio communication device according to claim 11, further comprising
a frequency error detector to detect whether the frequency of the oscillation signal output from the oscillator is out of a previously determined frequency range,
wherein the trigger signal generator outputs the trigger signal when the frequency error detector detects that the frequency of the oscillation signal is out of the frequency range.

19. The radio communication device according to claim 11, further comprising an integrated circuit comprising the oscillator, the receiver, the phase frequency detector, the reference phase generator, the differentiator, the oscillator controller, the phase initializer, the trigger signal generator, and the power supply controller.

20. A radio communication method comprising:
outputting an oscillation signal;
performing reception processing of a reception signal in synchronization with the oscillation signal;
outputting a first signal in response to a phase and a frequency of the oscillation signal based on a reference signal;
generating a second signal indicating a reference phase by integrating a frequency control signal;
generating a third signal being a difference between the first signal and the second signal;
generating a fourth signal for controlling the phase and the frequency of the oscillator, based on the third signal;
outputting an initialization signal for synchronizing a phase of the second signal with a phase of the first signal;
outputting a trigger signal indicating timing with which the outputting the initialization signal outputs the initialization signal; and
controlling whether to perform the outputting the first signal, the generating the second signal, the generating the third signal, the generating the fourth signal, and the outputting the initialization signal, with a power supply voltage supplied, based on the trigger signal.

* * * * *